(12) United States Patent
Vejzovic

(10) Patent No.: US 7,560,992 B2
(45) Date of Patent: Jul. 14, 2009

(54) DYNAMICALLY BIASED AMPLIFIER

(75) Inventor: Hamid Vejzovic, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 86 days.

(21) Appl. No.: 10/587,219

(22) PCT Filed: Feb. 17, 2004

(86) PCT No.: PCT/SE2004/000213

§ 371 (c)(1),
(2), (4) Date: Jun. 4, 2007

(87) PCT Pub. No.: WO2005/078917

PCT Pub. Date: Aug. 25, 2005

(65) Prior Publication Data

US 2007/0268074 A1    Nov. 22, 2007

(51) Int. Cl.
*H03G 3/30*    (2006.01)
(52) U.S. Cl. .................. 330/296; 330/285
(58) Field of Classification Search ............ 330/285, 330/296
See application file for complete search history.

(56) References Cited

U.S. PATENT DOCUMENTS

| | | | |
|---|---|---|---|
| 5,757,237 A | 5/1998 | Staudinger et al. | 330/296 |
| 6,300,837 B1 | 10/2001 | Sowlati et al. | 330/296 |
| 6,927,634 B1 * | 8/2005 | Kobayashi | 330/296 |
| 2003/0006845 A1 | 1/2003 | Lopez et al. | 330/289 |

OTHER PUBLICATIONS

International Search Report for PCT/SE2004/000213 dated Sep. 24, 2004.

* cited by examiner

*Primary Examiner*—Steven J Mottola
(74) *Attorney, Agent, or Firm*—Nixon & Vanderhye, P.C.

(57) ABSTRACT

The present invention provides dynamic biasing of transistor in an amplifier (1) comprising at least two interconnected transistor (10, 20) provided for processing an input signal. Once the input signal is applied to a driver transistor (10), a DC current signal of the output electrode (16) of this transistor (10) is detected. This DC current detection could be implemented as a detection of a voltage drop by providing the DC current signal to a resistor (130). A dynamic bias signal is then generated based on this detected DC current signal or voltage drop proportional to the DC current signal. The bias signal is applied to an input electrode (22) of a final transistor (20) for providing dynamic biasing thereof. The biasing of the invention reduces the intermodulation distortion of the final transistor (20) and amplifier (1). In addition, the biasing enables an automatic change of operation class for the transistor (20).

20 Claims, 10 Drawing Sheets

DYNAMICALLY BIASED AMPLIFIER

This application is the US national phase of international application PCT/SE2004/000213 filed 17 Feb. 2004, which designated the U.S., the entire content of which is hereby incorporated by reference.

TECHNICAL FIELD

The present invention generally refers to amplifiers and amplifier stages, and in particular to dynamically biasing of such amplifiers and amplifier stages.

BACKGROUND

A radio frequency (RF) power amplifier, for example of a transmitter in a wireless communications system, typically includes interconnected transistor circuits for amplifying a RF signal to a high power level. The amplified RF signal could then be transmitted into space via an antenna.

Modern wireless communications systems relay on the use of complex digital modulation schemes and multiple carriers to fulfill the requirements of high data transmission capacity over a minimal frequency spectrum. As a consequence, the amplified RF signal to be transmitted and received has usually a complex and strongly time-varying envelope. This complex signal behavior may result in different forms of distortion, including adjacent and alternate channel distortion and intermodulation distortion (IMD). For digital communications system IMD is a large problem since IMD products can be interpreted by the digital system as payload signals. Thus, stringent linearity requirements are imposed on the RF power amplifier and its including elements to suppress the IMD products. A commonly applied technique to improve the linearity of the power amplifier is to apply a biasing signal so that the transistors of the amplifier are caused to operate in a more linear portion of their available operation range.

A possible prior art solution for generating the biasing signal is to directly detect the power of an input RF signal of the amplifier and generate the biasing signal based thereon. However, such solutions are very complex and require digital signal processors, thereby increasing the complexity and the cost of the amplifier.

U.S. Pat. No. 5,757,237 discloses a power amplifier that includes two cascaded MESFETs (metal semiconductor field effect transistors) and a dynamic biasing circuit. This dynamic biasing circuit in turn comprises a sampling circuit and a voltage summing circuit. An input RF signal is provided to the gate electrode of the first MESFET, which outputs an intermediate AC (alternating current) signal at its drain electrode. This AC signal is brought through an impedance matching element to the gate of the second MESFET. An output RF signal is then provided at the drain of this second MESFET. The sampling circuit is connected to the drain electrode of the first MESFET for detecting the amplitude of an envelope of the intermediate AC signal. Based on this AC signal a bias adjusting signal is generated by the sampling circuit and is provided to the summing circuit. This summing circuit is also connected to a fixed bias voltage source. The bias adjusting signal from the sampling circuit is then used to modulate the fixed DC voltage signal from this voltage source in order to generate a dynamic biasing signal. This resulting biasing signal is applied to the gate electrode of the second MESFET.

A major problem with the dynamic biasing solution presented by U.S. Pat. No. 5,757,237 is the operation of the sampling circuit. Detection of the amplitude of the envelope the intermediate AC signal requires a very fast sampling circuitry solution. In particular for detecting RF signals with a frequency in the order of 100 MHz or GHz and creating a bias adjusting signal therefrom is extremely difficult and almost next to impossible. As a consequence the biasing circuit of U.S. Pat. No. 5,757,237 is not suitable for usage with the high-frequency RF signals of modern wireless communications systems.

SUMMARY

The technology disclosed herein overcomes these and other drawbacks of the prior art arrangements.

The technology disclosed herein provides a dynamic biasing of an amplifier and of transistors in the amplifier.

The technology disclosed herein also provides a dynamic biasing that reduces intermodulation distortion (IMD) for the amplifier.

The technology disclosed herein further provides a dynamic biasing that enables automatic change of operation class for the transistors.

The technology disclosed herein yet further provides a dynamic biasing that can be applied to an amplifier used in modern wireless communications systems and implemented with a simple circuitry solution.

Briefly, the technology disclosed herein involves a dynamic biasing of an amplifier comprising transistors and an associated dynamic bias circuit. The amplifier of an example embodiment includes at least two interconnected transistors that are provided for processing, e.g. serially (cascade connection), parallely (parallel connection) or serially and parallely, an input signal. The dynamic bias circuit is connected to the output electrode of a first or driver transistor. In operation when the input signal is applied to, at least, the driver transistor this bias circuit is arranged for detecting a resulting direct current (DC) signal on the output electrode of the driver transistor. In a preferred embodiment of the invention, this DC signal is a DC current signal, e.g. DC drain current signal for a driver transistor of FET (field effect transistor) type. The bias circuit generates a dynamic bias signal, e.g. DC voltage or current signal, based on this detected DC current. The generated bias signal is then applied to the input electrode of a second or final transistor, and a dynamic biasing thereof is obtained.

In a preferred example embodiment the dynamic bias circuit detects the DC signal as a voltage drop. In such a case, the DC current is provided to a voltage drop generating element, such as a resistor, and an operation amplifier, transistor or other voltage drop detecting circuitry then detects the resulting voltage drop caused by the DC current running through the resistor.

The arising DC current of the driver transistor depends dynamically on the power level of the input signal applied to the transistor. The generated voltage drop over e.g. the resistor depends on the DC current through the resistor and the bias signal is generated based on this voltage drop. Thus, through the above listed relations a bias signal that dynamically depends on the power level of the applied input signal is provided.

Generating a dynamic bias signal for the final transistor based on the DC current for the output electrode of the driver transistor (and, thus on the input power) enables a reduction of the intermodulation distortion for the amplifier and the final transistor. Thus, the bias signal causes the final transistor to operate at a minimum IMD and the linearity of the amplifier increases. Furthermore, dynamically adjusting the bias signal for the final transistor according to the technology disclosed herein, makes it is possible to automatically change operation class for this transistor. Thus, properties from different operation classes can be obtained by the technology disclosed herein and the final transistor can be caused to operate in a transistor operation class that presently is most suitable.

The dynamic bias signal generated by the bias circuit based on the DC (current) signal can be applied directly to the final transistor. However, in some applications it may be preferred to firstly adjust, e.g. amplify, the bias signal before providing it to the transistor. A transistor circuit or other signal processing or amplifying circuitry can realize this adjustment.

The dynamic bias circuit of the technology disclosed herein can be applied to several amplifier designs and transistor circuits, including serial and parallel combinations of transistor, where a first (driver) transistor is controlling at least a second (final transistor). The amplifier can also comprise additional transistors that participate in the processing of the input signal. In such a case, the dynamic bias circuit can be arranged in an amplifier comprising both serially and parallely connected transistors. The bias signal can be generated based on the DC output current of any transistor in the amplifier, but it is preferred to use the DC current of at least one of the driver transistors. Similarly, the bias signal can be applied to any transistor in the amplifier, but it is preferred to provide it to at least one of the final transistors since these in most cases contribute mostly to the IMD. Thus, the dynamic bias circuit can be connected to transistors in a general amplifier stage, but is particularly adapted for usage in connection with the final amplifier stage of an amplifier.

The transistors of the amplifier could independently be of any FET design, such as JFET (junction FET), IGFET (insulated gate FET), MESFET (metal semiconductor FET) or MOSFET (metal oxide semiconductor FET). Furthermore, other types of transistors, including bipolar transistors could also be employed.

The technology disclosed herein offers the following example advantages:
  Reduces and suppresses IMD;
  Increases the linearity of the amplifier;
  Enables automatic change of operation class for a transistor;
  Can be implemented by a simple circuitry solution;
  Can be applied to different amplifier designs and transistor types; and
  Can be used in modem high-frequency wireless communications systems.

Other advantages offered by the technology disclosed herein will be appreciated upon reading of the below description of the example embodiments.

SHORT DESCRIPTION OF THE DRAWINGS

The invention together with further objects and advantages thereof, may best be understood by making reference to the following description taken together with the accompanying drawings, in which.

DETAILED DESCRIPTION

Figure 1:
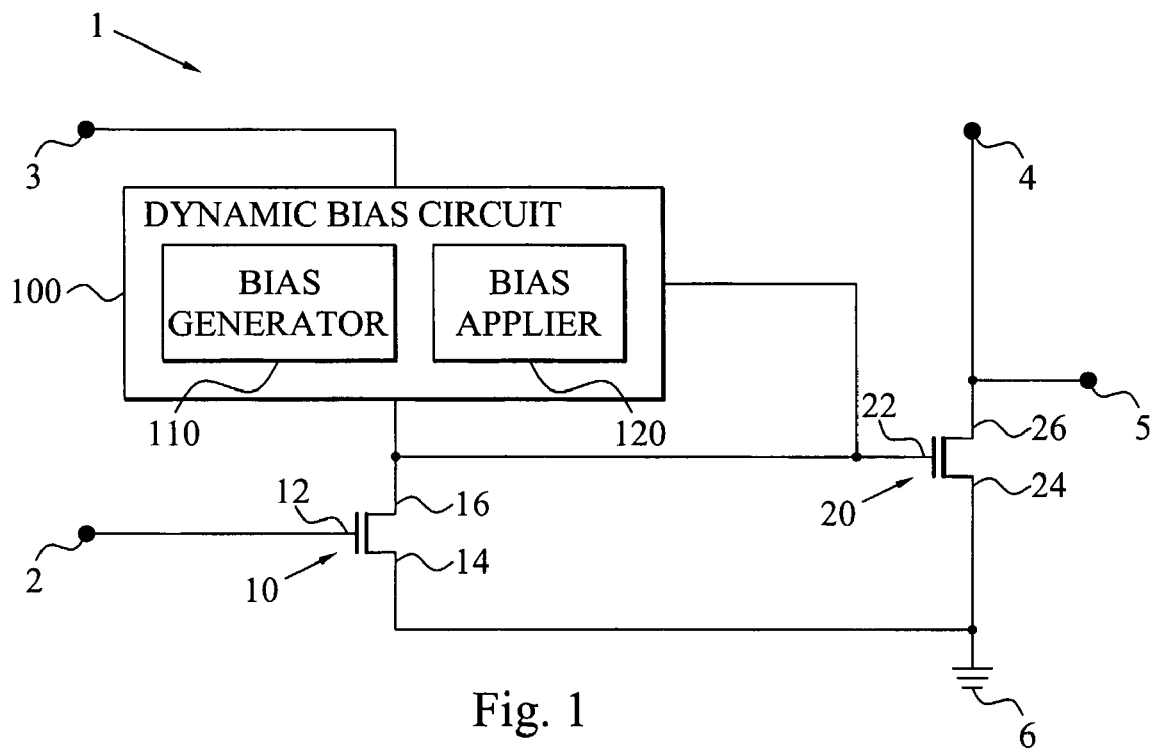
FIG. 1 is a schematic diagram of an embodiment of a power amplifier with a dynamic bias circuit according to the present invention.

Throughout the drawings, the same reference characters will be used for corresponding or similar elements.

The technology disclosed herein relates to dynamic biasing of transistors in an amplifier in order reduce or suppress intermodulation distortion (IMD) and increase the linearity of the amplifier.

Generally, for a given output or input power level of an amplifier a bias signal can be adjusted and applied to improve IMD, i.e. reduce IMD. Since the output and input power are time-dependent the bias signal should follow this power change. The technology disclosed herein provides a dynamic bias circuit for use in amplifiers that is able to generate a bias signal based on the input (and output) power level of the amplifiers.

The dynamic bias circuit and amplifier discussed and disclosed herein are particularly suited for wireless communications applications. However, other applications will be readily apparent to those skilled in the art.

FIG. 1 is a schematic diagram of an embodiment of a power amplifier 1 or amplifier stage with a dynamic bias circuit 100 according to the technology disclosed herein. By way of example, the power amplifier 1 could for example be used to implement the last two amplifier stages of a radio frequency (RF) transmitter (not illustrated) e.g. in a mobile unit (not illustrated).

The amplifier 1 includes two transistors, exemplified as two general FETs (field effect transistors) 10, 20, interconnected in series in order to process in an input (RF) signal. The transistors 10, 20 could independently be of any FET design, such as JFET (junction FET), IGFET (insulated gate FET), MESFET (metal semiconductor FET) or MOSFET (metal oxide semiconductor FET). Furthermore, other types of transistors, including bipolar transistors could replace the first FET 10 and/or second FET 20. In the following the technology disclosed herein will be described and disclosed with reference to amplifier designs including FETs. However, any of the disclosed transistors could readily be exchanged by another transistor type.

The first FET or driver transistor 10 comprises a gate 12, source 14 and drain 16 electrode. The gate or input electrode 12 is adapted for receiving an input (RF) signal and is, in operation, connected to a RF signal source, schematically illustrated as an input terminal 2 in the figure. During operation, the source electrode 14 of the driver transistor 10 is connected to a conductor 6 for receiving a reference voltage level, for example ground reference voltage level. Correspondingly, the drain electrode 16 is arranged for connection with a supply voltage source or terminal 3. This drain or output electrode 16 is further connected to a gate electrode 22 of the second FET or final transistor 20. Similarly to the driver transistor 10, the source 24 and drain 26 electrodes of the final transistor 20 are connected to the conductor 6 and a supply voltage source or terminal 4, respectively. It is anticipated that the two terminals 3 and 4 could be connected to a common supply voltage, especially if the driver 10 and final 20 transistor is of a same type. Once the input (RF) signal is provided on the input terminal 2, the driver transistor 10 processes (amplifies) this signal and outputs an intermediate alternating current (AC) signal on its drain (output) electrode 16. This intermediate AC signal is brought to the gate (input) electrode 22 of the final transistor 22, which processes the signal and outputs a processed (amplified) RF output signal at an output terminal 5 connected to its drain electrode 26.

In addition to the two cascaded transistors 10, 20, the power amplifier 1 of FIG. 1 comprises a dynamic bias circuit 100. This bias circuit 100 has a first input terminal connected to the drain 16 of the driver transistor 10 and a second input terminal connected to the supply voltage terminal 3. An output terminal of the bias circuit 100 is connected to the gate 22 of the final transistor 20. The dynamic bias circuit 100 includes a bias generator 110 that is adapted for detecting a direct current (DC) signal from the driver transistor 10. This DC signal is preferably the DC current for the drain electrode 16 of the transistor 10. The bias generator 110 then generates a dynamic bias signal based on this detected DC (current) signal. The bias signal is brought to a bias applier 120 of the dynamic bias circuit 100 that applies the bias signal to the gate or input electrode 22 of the final transistor 20. As a consequence, an adjustment of the bias signal level for the final transistor 20 is obtained.

In the power amplifier of FIG. 1, the (drain) current of the driver 10 and final transistor follows the input power level. In addition, by monitoring the current (DC current signal) of the driver stage 10, the output power level therefrom can be detected. This output power level of the driver stage 10 provides knowledge of the output power level of the final transistor 20 and, thus, of the amplifier 1. As a result, the bias of the final transistor 20 can be adjusted for a given input and output power level to continuously obtain the best IMD performance. Furthermore, the linearity of the amplifier 1 is increased be generating and applying an optimal dynamic bias signal.

Figure 2:
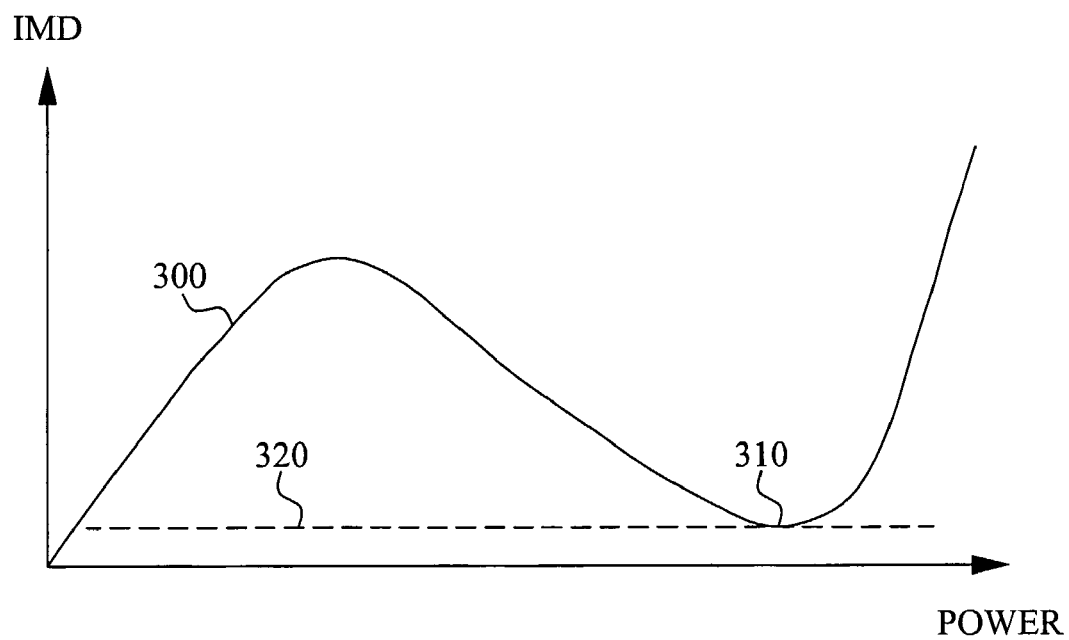
FIG. 2 is a diagram schematically illustrating intermodulation distortion (IMD) versus power level for a general transistor.

FIG. 2 is a diagram schematically illustrating IMD for a general transistor at different input or output power levels for the transistor. The IMD curve 300 generally has local maximum point at lower power levels. Increasing the power beyond this maximum point decreases the IMD curve 300 and it eventually reaches a minimum point 310. However, if the power increases further it will result in compression of the transistor and IMD increases dramatically. Thus, the optimal operation of the transistor in view of IMD is to operate the transistor at, or at least close to, the minimum IMD point 310. Generating a dynamic bias signal according to the technology disclosed herein and applying it to the transistor enables movement of this minimum point 310 to different power levels, schematically illustrated by a dotted line 320. Thus, the transistor is caused to preferably continuously operate at, or close to, the minimum IMD point 310, regardless of the current input or output power level. In other words, the applied bias signal enables the transistor to almost always operate at this minimum IMD.

Dynamic adjustment of the bias signal for the final transistor according to the technology disclosed herein makes it also possible to automatically change operation class for this transistor. Thus, properties from different operation classes can be obtained by the technology disclosed herein. As the person skilled in the art knows, a class A transistor operation is characterized by a large applied bias and good IMD performance and linearity. However, a major drawback is that the DC current consumption is high and the efficiency is low, in particular in back-off conditions. Prolonged operation with high current consumption and low efficiency may be a problem especially when the amplifier is arranged in a mobile unit with a limited energy supply (powered by batteries). Class AB, B and C operation have better efficiency but at the cost of worse IMD, in particular for higher output power levels. By dynamically adjusting and applying a bias signal generated according to the technology disclosed herein, the final transistor can be caused to operate in a transistor operation class that presently is most suitable. The actual choice of operation class may be changed based on input or output power level. Thus, by generating a bias signal that is based on the DC current signal of the driver transistor, which in turn is proportional to the input power of the RF signal, the operation class can be changed for different input power levels.

Figure 3:
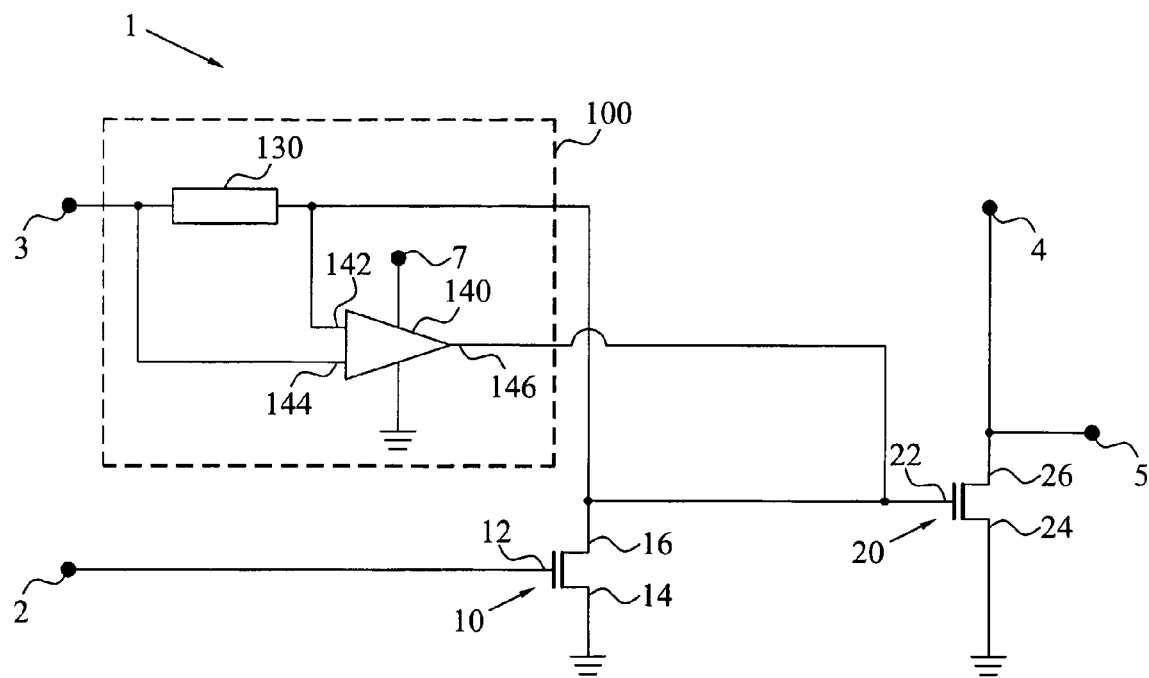
FIG. 3 is an illustration showing, in more detail, an embodiment of the dynamic bias circuit of the amplifier of FIG. 1.

FIG. 3 is an illustration showing a possible implementation of the dynamic bias circuit 100 according to the technology disclosed herein. In FIG. 3 the bias circuit 100 is realized as a voltage drop generator 130 and a voltage drop detector 140. The voltage drop generator could be a resistor 130 or any other resistance element that generates a voltage drop due to the DC current of the driver transistor 10 passing therethrough. An example of such another resistance element is a tapered metal, e.g. copper, wire. This resistor 130 has a first end connected to the drain electrode 16 of the driver transistor 10 and a second end connected to the supply voltage terminal 3. The voltage drop detector, exemplified as an operator amplifier 140 in the FIG. 3, is arranged for detecting the generated voltage drop as a voltage difference on its two input terminals 142, 144. The first input terminal 142 is connected to the drain 16 of the driver transistor 10 (and the first end of the resistor 130), whereas the second input terminal 144 is coupled to the voltage terminal 3 (and the second end of the resistor 130). Thus, the input voltage of terminal 142 is $V_{supply} - R_{130} I_d$, where $V_{supply}$ is the supply DC voltage of terminal 3, $R_{130}$ is the resistance value of the resistor 130 and $I_d$ is the (DC) drain current. The corresponding input voltage of terminal 144 is simply the supply voltage level $V_{supply}$. The operation amplifier 140 then generates the dynamic bias signal based on the voltage difference and applies it, as a bias DC voltage signal, through its output terminal 146 to the gate electrode 22 of the final transistor 20. Thus for this embodiment, a change in the input power of the RF signal results in a change in the DC drain current of the driver transistor 10. This current change affects the voltage drop proportionally and, thus, the output voltage of the operator amplifier 140. As a result, an efficient dynamic biasing of the final transistor 20 is obtained.

In FIG. 3 the operation amplifier 140 has been provided with a single voltage supply illustrated by voltage terminal 7 and the ground level. However, also a symmetric or unsymmetric supply voltage is possible.

The current detection and bias signal generation using the dynamic bias circuit 100 of FIG. 3 can be optimized based on the actual choice of driver 10 and/or final 20 transistor. Knowledge of the characteristics of the transistors 10 and/or 20, including e.g. access to their linearity diagrams, can be used for optimizing the operation amplifier 140. This optimization can be performed by manipulating the components and elements affecting the function of the operation amplifier 140 and/or through careful choice of operation amplifier type 140. For example, the actual choice of resistor 130 is affected by the type of final transistor 20 employed.

The resistor 130 and operation amplifier 140 of the dynamic bias circuit 100 in FIG. 3 can be exchanged for any other DC current detecting element or circuitry. There are several dedicated or adapted, often operation amplifier based, circuits for DC current detection known in the art, including current sensing integrated circuits (ICs). Any such circuit could then be included in the bias circuit 100 of the technology disclosed herein for current detection and possibly bias signal generation purposes.

Figure 4:
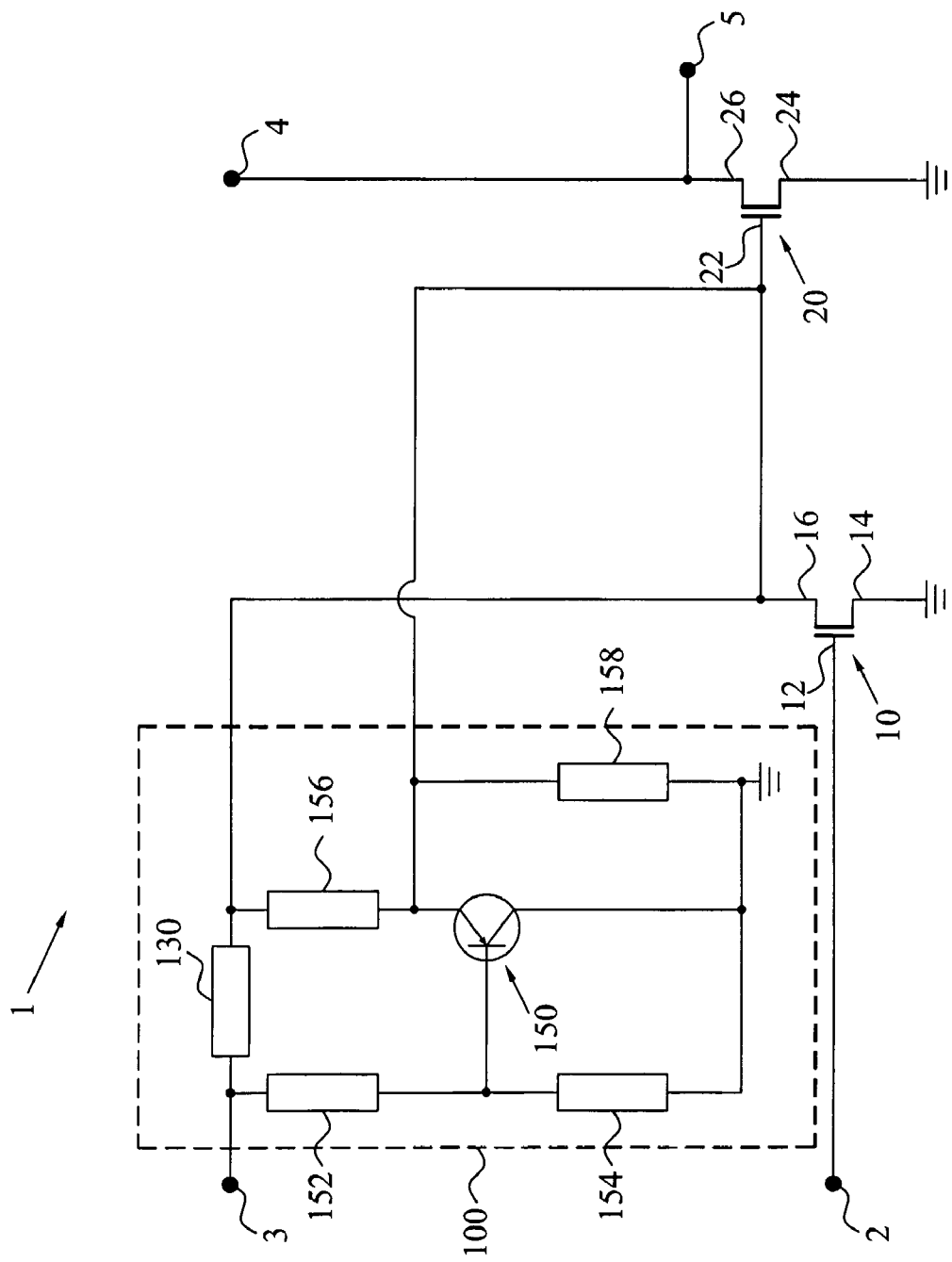
FIG. 4 is an illustration showing, in more detail, another embodiment of the dynamic bias circuit of the amplifier of FIG. 1.

Another possible implementation of the dynamic bias circuit 100 of the technology disclosed herein is illustrated in FIG. 4. This bias circuit 100 is similar to the circuit discussed above in connection with FIG. 3 except that the operation amplifier (voltage drop detector) has been exchanged by a bipolar transistor 150. However, this bipolar transistor 150 generally performs the same functionality as the operation amplifier of FIG. 3, i.e. detects a voltage drop over a resistor 130 caused by the DC drain current of the driver transistor 10.

A first resistor 152 of the dynamic bias circuit 100 is connected to the supply voltage terminal 3 and to a first electrode of the voltage drop generating resistor 130. The other electrode of the resistor 152 is coupled to the base electrode of the transistor 150 and to a second resistor 154, which is also connected to the conductor or ground level. The supply voltage 3 and the voltage divider formed by the two resistors 152, 154 provide the transistor 150 with a (fixed) base bias. A resistor 156, connected to the emitter of the transistor 150 and to a second electrode of the resistor 130 (and to the drain electrode 16 of the driver transistor 10), serves as an AC signal blocking element to block the transmission of the intermediate AC signal from the drain electrode 16 to the transistor 150. A further optional transistor 158 having a stabilizing function for the transistor 150 is connected between the emitter and ground. The collector electrode of the bipolar transistor 150 is also connected to ground.

The transistor 150 generates a bias signal that depends on the voltage drop over resistor 130 and, thus, on the DC drain current of the driver transistor 10 and on the power of the input RF signal. The emitter is connected to the gate electrode 22 of the final transistor 20 and applies the generated bias signal thereto.

Depending on the actual choice of second or final transistor in FIGS. 3-4, the bias signal generated by the operation amplifier or transistor may be sufficient for efficient biasing of the final transistor. However, in some applications it is preferred to e.g. amplify or otherwise adjust the bias signal before applying it to the final transistor. This is particular the case if the final transistor is a bipolar transistor or a large FET transistor, and thus requires a fairly large bias signal for efficient operation. In such a case, it may be possible that the operation amplifier or transistor is unable to directly generate such a large bias signal. This is solved by introducing bias signal processing or amplifying elements or circuitry in the dynamic bias circuit, which is exemplified in FIG. 5.

Figure 5:
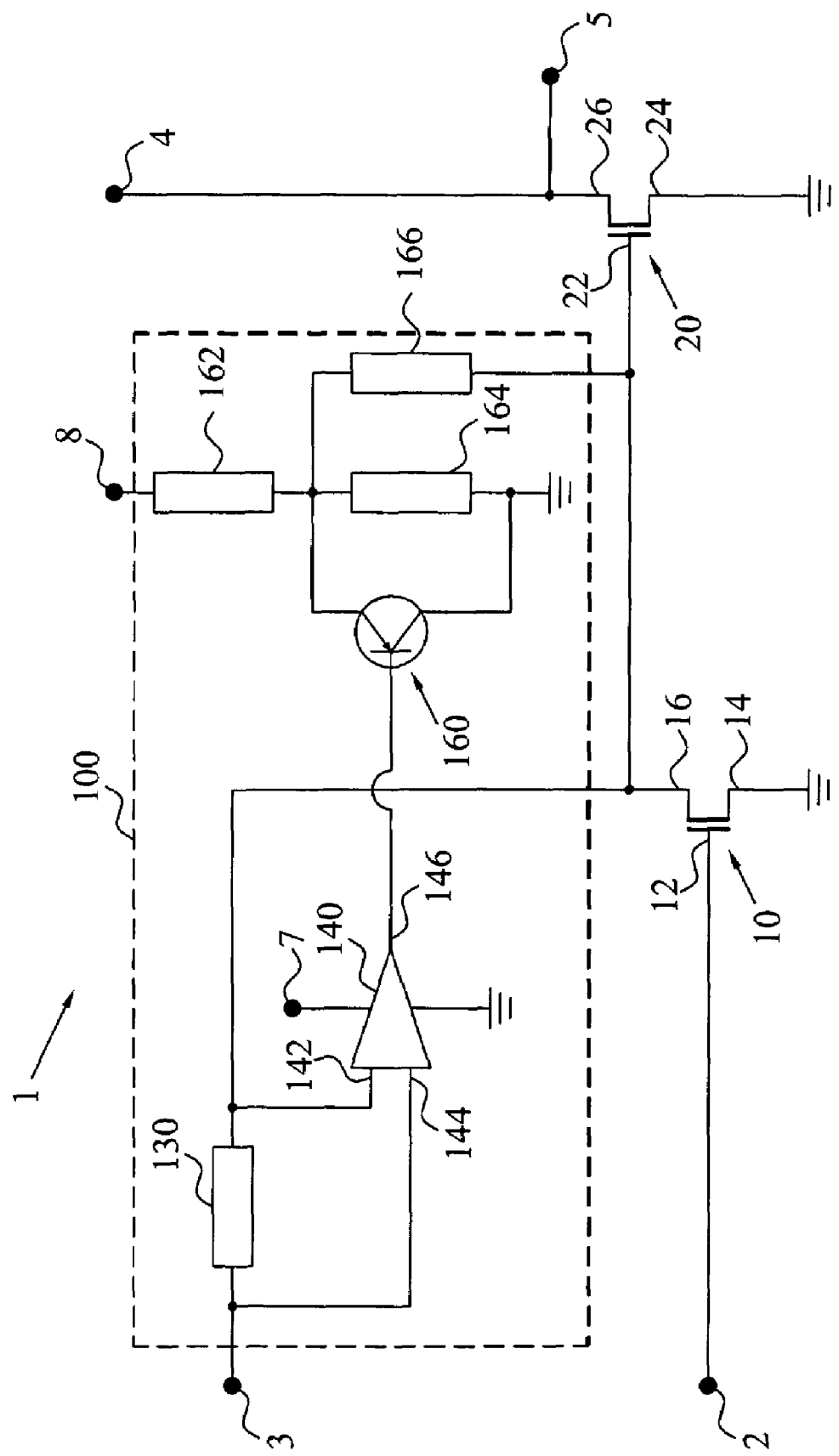
FIG. 5 is an illustration showing, in more detail, yet another embodiment of the dynamic bias circuit of the amplifier of FIG. 1.

The power amplifier 1 of FIG. 5 corresponds to the amplifier of FIG. 3 with addition of a bias signal amplifying transistor 160. The transistor 160, here exemplified by a bipolar transistor, has a base electrode connected to the output terminal 146 of the operation amplifier 140. The collector is connected to the conductor or ground level, whereas the emitter electrode is coupled to three resistors 162, 164 and 166. The two resistors 162, 164 forms a voltage divider that provides, together with the supply voltage source or terminal 8, an emitter bias. The third resistor 166 is coupled to the gate electrode 22 of the final transistor 20. The functionality of this resistor 166 corresponds to resistor 156 of FIG. 4, i.e. it serves as an AC signal blocking element.

In operation, when an input RF signal is applied, a DC drain current of the driver transistor 10 depending on the power of the input signal is generated. The resistor 130 is in series with the drain current and the DC current therethrough is detected by the operation amplifier 140, which outputs a voltage proportional to the current through the resistor 130. This output bias voltage is driving the base of the transistor 160. The relation of the resistors 162, 164 together with the amplified output bias signal of the transistor 160 determines the voltage on the gate 22 of the final transistor 20 and, thus, the dynamic bias signal. As a result, a dynamically biasing that is tracking the input power to the driver transistor 10 is obtained.

The general function of the transistor 160 and its connecting resistors 162, and 164 is, thus, to adjust, e.g. amplify, the bias signal for the final transistor 20.

Figure 6:
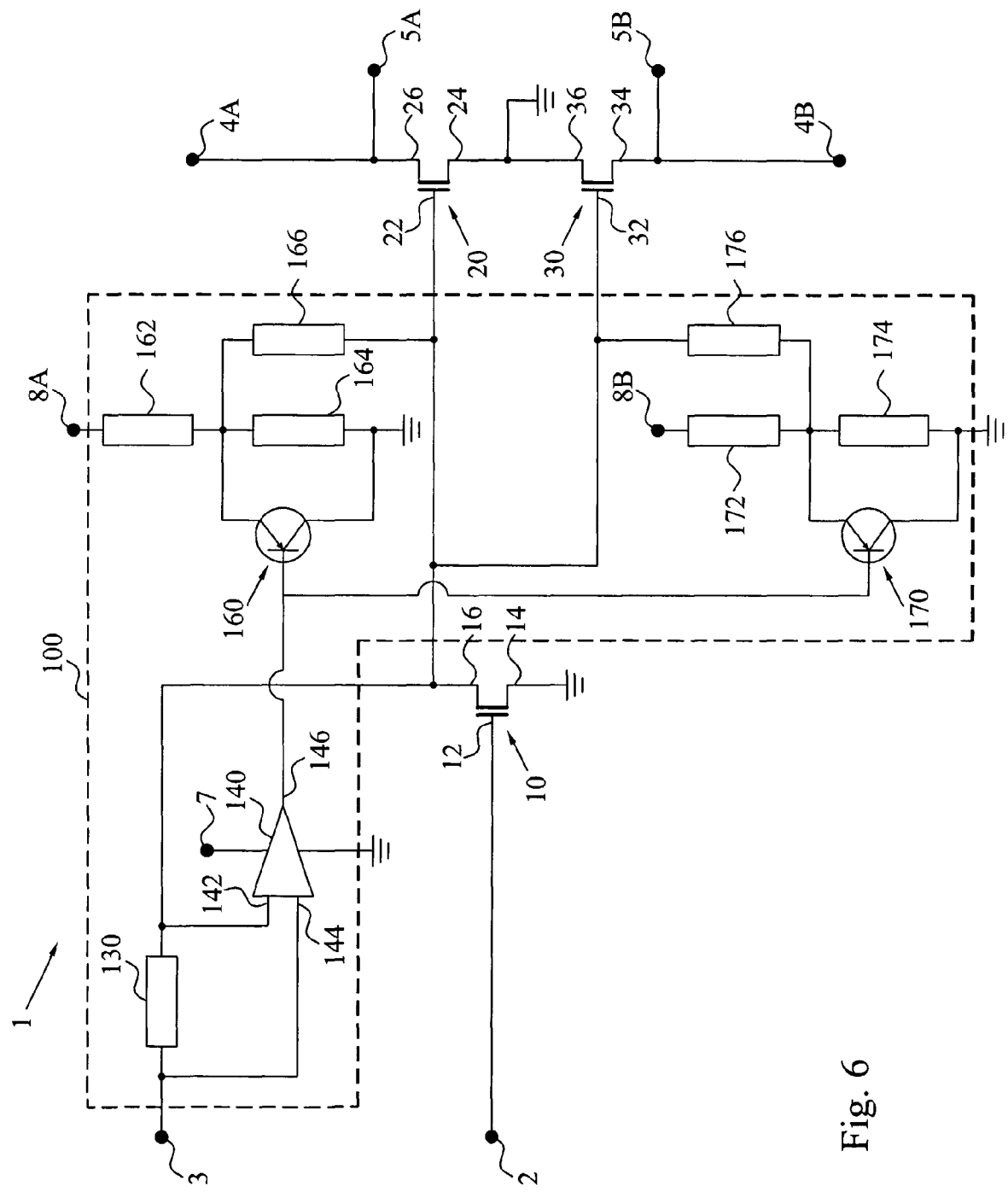
FIG. 6 is an illustration of another example embodiment of a power amplifier with a dynamic bias circuit.

The technology disclosed herein is not limited to an amplifier comprising a driver transistor and a single final transistor. FIG. 6 illustrates a power amplifier 1 including a driver transistor 10 driving two parallel final transistors 20, 30. The amplifier 1 also comprises a dynamic bias circuit 100 according to the technology disclosed herein, here illustrated by a voltage drop generating resistor 130, operation amplifier 140 and two bias signal amplifying transistors 160, 170. Correspondingly to the first final transistor 20, a second final transistor 30 has a gate electrode 32 connected to the output drain electrode 16 of driver transistor 10 and adapted for receiving the intermediate AC signal therefrom. The source electrodes 24, 34 of the final transistors 20, 30 are connected to the ground level or conductor, whereas their respective drain electrodes 26, 36 are coupled to supply DC voltage terminals or sources 4A, 4B and to output terminals 5A, 5B. It is anticipated by the invention that the two supply voltage terminals 4A, 4B may be interconnected, i.e. provide one and the same supply voltage to the two final transistors 20, 30, especially if the transistors 20, 30 are of a same type. In addition, the power amplifier 1 could provide two, possibly different, output RF signals via output terminal 5A, 5B. However, these terminals 5A, 5B could be interconnected to output a single RF signal.

The generated bias signal from the operation amplifier 140 could be provided directly to the gate (input) electrodes 22, 32 of the final transistors 20, 30, or through a single bias signal processing or amplifying circuitry, e.g. a transistor with connected resistors and a supply voltage terminal. However, in some applications it is preferred to employ two such bias amplifying circuits, one for each final transistor 20, 30, which is illustrated in the figure. The first circuitry comprises a transistor 160, three resistors 162, 164 and 166 and a supply voltage 8A, which were discussed in connection to FIG. 5. Correspondingly, the second circuitry includes a (bipolar) transistor 170 with base connected to output terminal 146 of the operation amplifier 140, collector coupled to ground and emitter connected to three transistors 172, 174 and 176. The two transistors 172, 174 provides together with supply voltage terminal 8B an emitter bias for the transistor 170. The third transistor 176 forms an AC blocking element.

By having a bias signal adjusting circuitry for each final transistor 20, 30, the including elements (resistors 162-164; 172-174 and transistors 160; 170) of each circuitry can be adapted to respective transistor 20, 30 in order to apply an as optimal bias signal as possible.

This teaching can also be generalized to three or more final transistors, which then preferably each have access to a dedicated bias signal adjusting circuitry or some final transistors share a single bias signal adjusting circuitry.

Figure 7:
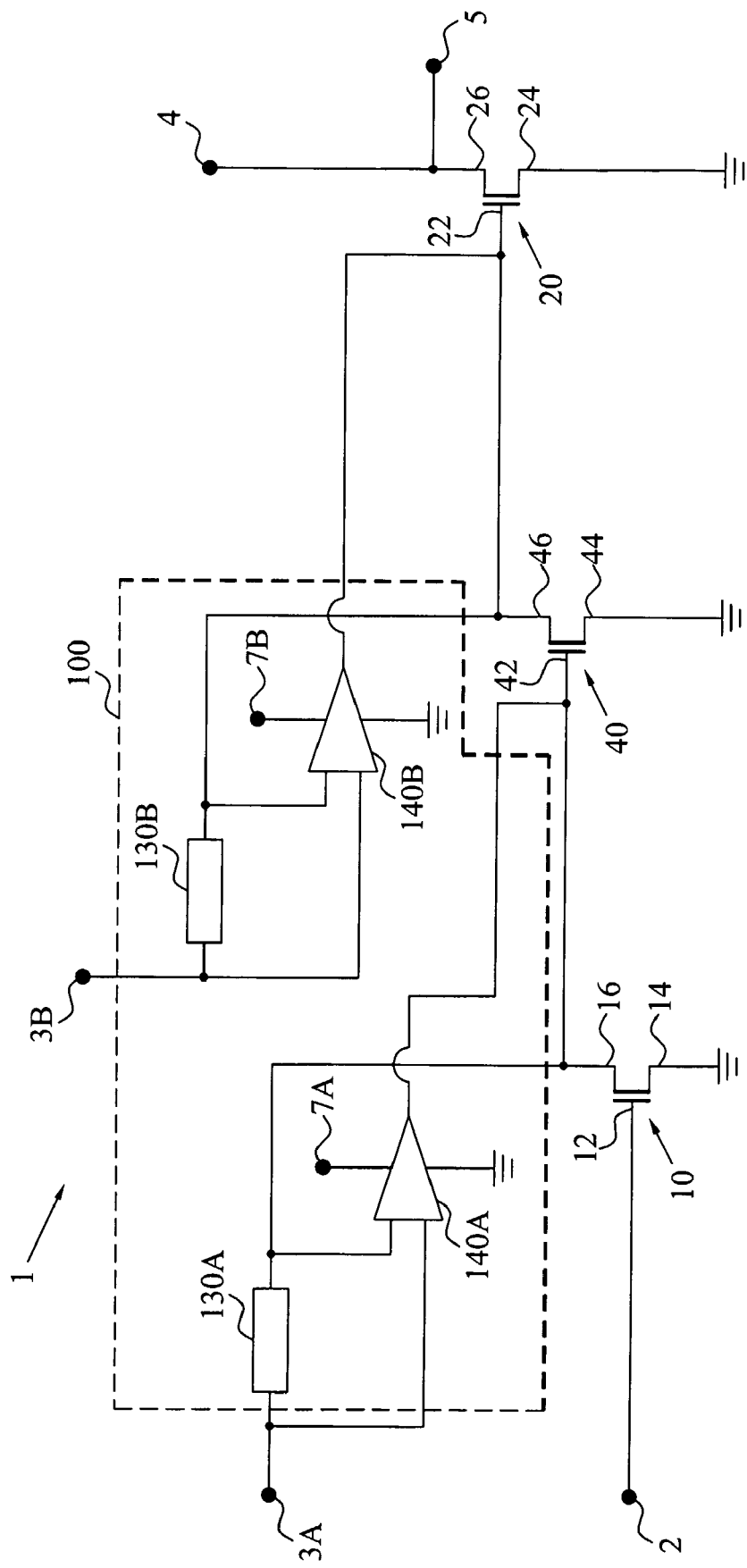
FIG. 7 is an illustration of yet another example embodiment of a power amplifier with a dynamic bias circuit.

In the preceding FIGS. 1 and 3-6, the power amplifier has been illustrated as a two-step amplifier with a single driver transistor cascade connected to one or several final transistors. FIG. 7 illustrates another possible power amplifier design according to the technology disclosed herein. This amplifier 1 comprises three cascaded transistors 10, 20 and 40 and a dynamic bias circuit 100. A first driver transistor 10 is adapted for receiving an input RF signal and for generating a first intermediate AC signal. This AC signal is applied to a gate electrode 42 of a second driver transistor 40 that processes the signal and outputs a second intermediate AC signal at its drain electrode 46. This second AC signal is applied to the final transistor 20, which generates an output RF signal.

In this embodiment, the bias circuit 100 comprises a first resistor 130A for generating a voltage drop by means of the DC drain current of the first driver transistor 10. A first operation amplifier 140A detects the arising voltage drop over the resistor 130A and outputs a bias signal that is applied to the gate 42 of the second driver transistor 40. A corresponding second resistor 130B, connected to the drain electrode 46 of second driver transistor 40 and to a supply voltage terminal 3B, generates a voltage drop by means of the DC drain current of this transistor 40. A second operation amplifier 140B detects this voltage drop over the resistor 130B and outputs a bias signal that is applied to the final transistor 20. Thus, in this embodiment a dynamic biasing is provided to both the second and third (final) stage of the transistor cascade. Supply voltage terminals 7A and 7B have the same functionality as terminal 7 in FIG. 3.

The design of dynamic bias circuit 100 for the power amplifier 1 of FIG. 7 can be adjusted based on the choice transistors 10, 20 and 40 and/or operation of the amplifier 1. For example, a bias signal adjusting or amplifying circuitry could be arranged between the output terminals of respective operation amplifier 140A, 140B and the gate electrodes 22, 42 of the transistors 20, 40. Furthermore, the bias circuit 100 could include only a single DC current detecting and bias signal generating functionality, for example the transistor 130A and operation amplifier 140A, i.e. the resistor 130B and operation amplifier 140B are omitted. Thus, a bias signal generated based on the drain current of the first driver transistor 10 is applied to the second driver transistor 40. However, since the final transistor 20 of an amplifier 1 in most cases gives a larger contribution to IMD than the other transistors 10, 40, it may be particularly advantageous to dynamically bias this final transistor 20. In such a case, the output bias signal from the single operation amplifier 140A is applied to the final transistor 20 or to both the second driver transistor 40 and the final transistor 20. Alternatively, the resistor 130A and operation amplifier 140A are omitted. Then, the DC drain current of the second driver transistor 40 is used for biasing the final transistor 20.

As yet another alternative, the dynamic bias circuit 100 illustrated in FIG. 7 is modified so that the output terminal of the first operation amplifier 140A is connected to the gate electrode 22 of the final transistor 20 instead of to the second driver transistor 40. In this embodiment, two bias pre-signals are generated, each based on the respective DC drain current of the two driver transistors 10, 40. The two pre-signals are then combined in a suitable manner and are applied to the gate 22 of the final transistor 20.

Figure 8:
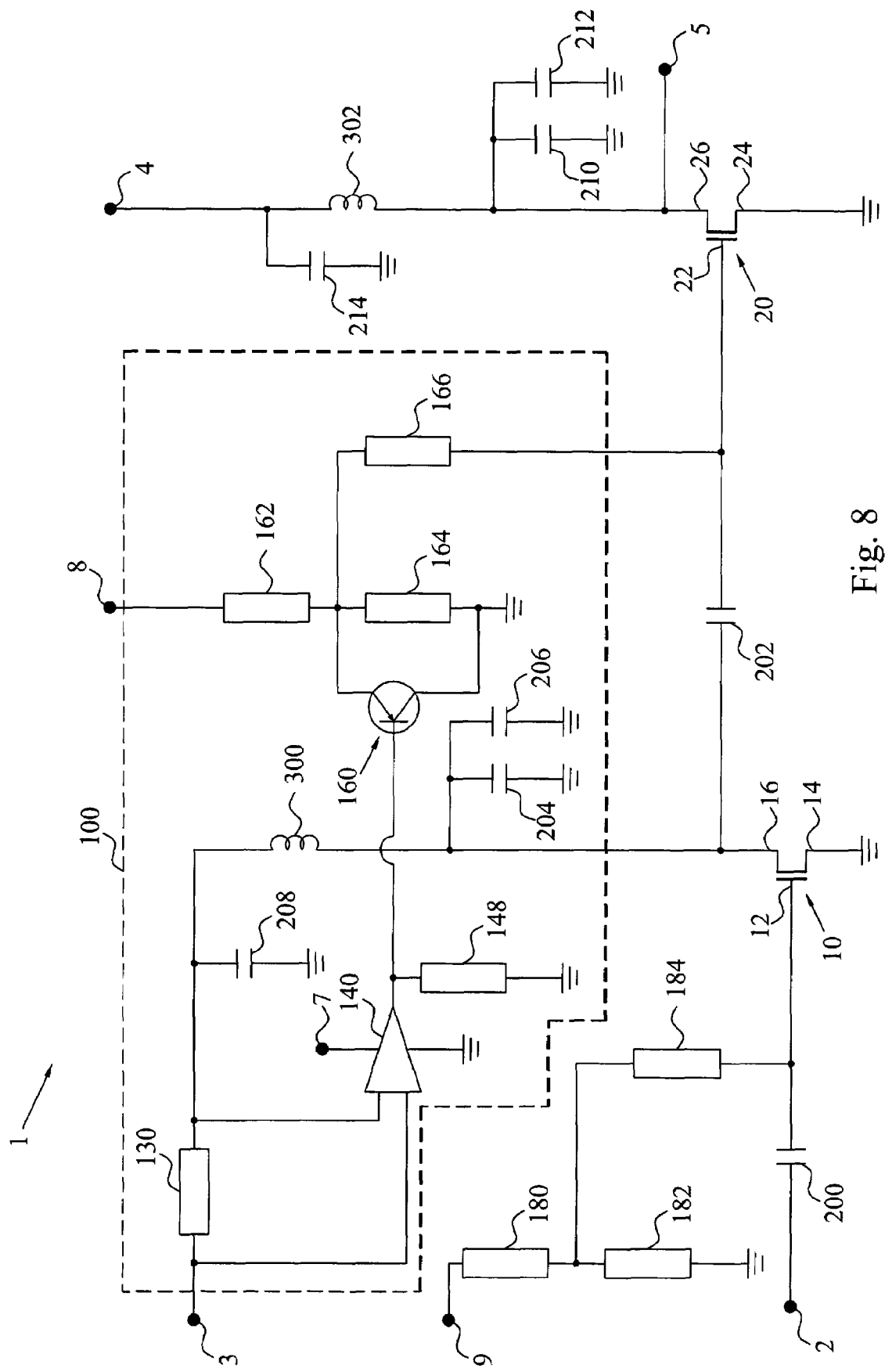
FIG. 8 is a detailed diagram of the power amplifier of FIG. 5.

FIG. 8 is a more detailed diagram of the power amplifier 1 of FIG. 5. The amplifier 1 includes a capacitor 200 connected between the gate 12 of the driver transistor 10 and the input RF signal source 2. This capacitor 200 blocks any DC voltage between the source 2 and the transistor 10. A corresponding capacitor 202 is arranged between the drain 16 of the driver transistor 10 and the gate 22 of the final transistor 20 for blocking a DC voltage between the transistors 10, 20.

The driver transistor 10 is further equipped with a (fixed) gate bias, implemented as a supply voltage terminal or source 9 and a voltage divider formed by the interconnected resistors 180, 182. A further resistor 184 blocks the AC input signal from reaching the resistors 180, 182.

Inductors 300, 302 are connected between the drain 16 of the driver transistor 10 and the voltage drop generating resistor 130 and between the drain 26 of the final transistor 20 and the voltage supply terminal 4. These inductors 300, 302 serve as AC signal decoupling elements and are arranged for filtering the RF signal from the DC supply voltages, i.e. block transmission of the intermediate AC signal and output RF signal to the supply terminals 3, 4, and simultaneously provide a current path for the drain currents of respective transistors 10, 20. The inductors 300, 302 may be replaced with other circuit elements, resistors, low frequency signal filtering circuits, etc. performing similar operation. The inductors 300, 302 together with the capacitors 204-208 and 210-214 also operate for recreating the whole period of the RF signal, which is well known to the person skilled in the art. The capacitors 204-208 and 210-214 further stabilize DC voltages, especially for the high drain currents caused by the peak power of the RF signal. At this peak power level of the RF signal, the transistors 10, 20 consume a rather high current from the (DC) voltage supply terminals 3, 4. However, due to the high current the DC voltage from the supply terminals 3, 4 temporarily drops because of an inner resistance of the voltage sources connected to the terminals 3, 4. During this short period of time, the voltage from the capacitors 204-208 and 210-214 compensates the temporary voltage drop. The capacitors 204, 206 and 210, 212 also decouple any frequencies in the RF signal that should not be amplified by the power amplifier 1. In most applications, several capacitors 204, 206 and 210, 212 of different capacitances are often required depending on which frequency interval(s) that should be decoupled. The resistor 148 connected between the output terminal of the operation amplifier 140 and the conductor or ground level has a stabilizing function.

The dynamic bias circuit according to the technology disclosed herein has hitherto been described and disclosed with reference to an amplifier or amplifier stage comprising cascade connected transistors. However, the technology disclosed herein is not limited to such amplifier designs. The bias circuit can also be applied to other transistor connections employed in the art, such as parallel transistor connections and combinations of parallel and serial connections. A general transistor connection design, to which the teaching of the technology disclosed herein can be applied, comprises at least two interconnected transistor adapted for processing, e.g. serially (cascade connection), parallely (parallel connection) or serially and parallely, an input signal.

Figure 9:
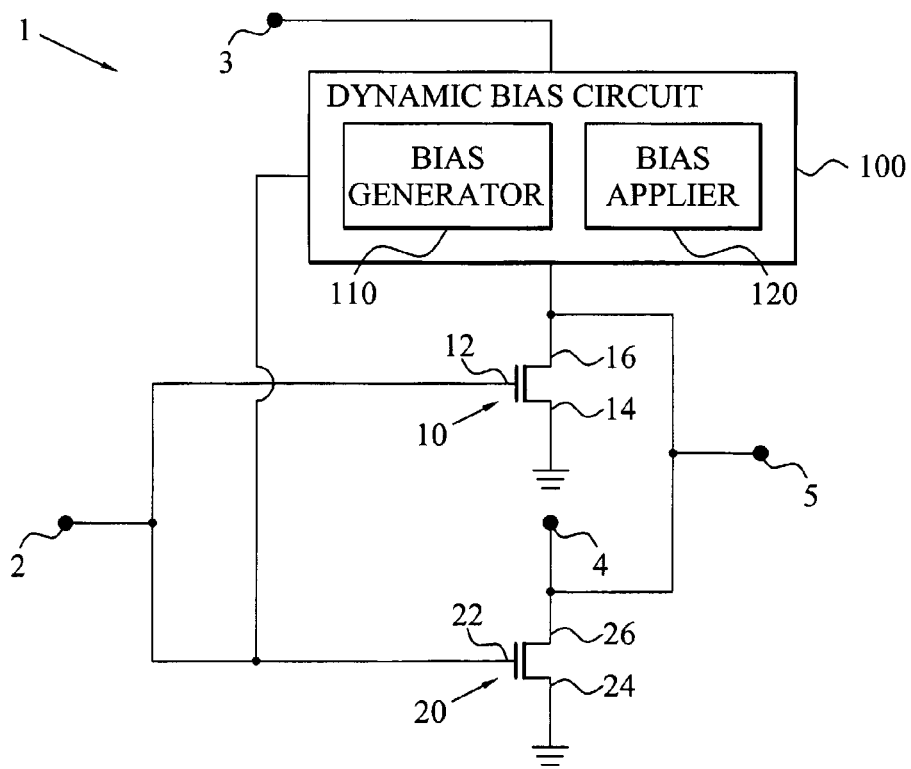
FIG. 9 is a schematic diagram of another example embodiment of a power amplifier with a dynamic bias circuit.

FIG. 9 is a schematic diagram of an example embodiment of a power amplifier 1 with a dynamic bias circuit according to the technology disclosed herein. This power amplifier 1 comprises two parallel-connected transistors 10, 20. The gate electrodes 12, 14 of the transistors 10, 20 are connected for, in operation, receiving an input RF signal from an input signal terminal or source 2. The source electrodes 14, 24 are connected to a reference voltage level, e.g. ground. The drain electrodes 16, 26 are in connection with voltage supply sources, represented as two different terminals 3, 4 in the figure, but can be realized as a single common supply terminal. Furthermore, the drain electrodes 16, 26 are coupled to an output terminal 5 for providing a processed (amplified) output RF signal.

A dynamic bias circuit 100 according to the technology disclosed herein is arranged in the amplifier 1 for detecting the DC (drain) current signal of the first transistor 10. Thus, the bias circuit 100 is connected between the voltage supply terminal 3 and the drain electrode 16 of the transistor 10. As was discussed in connection with FIG. 1, the bias circuit 100 comprises a bias generator 110 for generating a bias signal based on the DC drain current, e.g. as determined based on a detected voltage drop caused by the drain current. The bias signal is then provided by a bias applier 120 to the gate (input) electrode of the second transistor 20. In other words, a dynamic biasing of this second transistor 20 based on the DC drain current and, thus, the power of the input RF signal is obtained. This dynamic biasing enables efficient operation of the transistor 20 and the amplifier 1 by suppressing the IMD for this transistor 20.

As is known in the art, cascaded transistors of a power amplifier are usually used to increase the gain, whereas a parallel connection of transistors increases the power of the processed RF signal. Often a combination of these two connections is employed to increase both the gain and the output power. Such a power amplifier 1 having both transistors connected in series and in parallel is disclosed in FIG. 10.

The amplifier comprises two driver transistors 10, 50 with source electrodes 14, 54 connected to ground or a reference voltage level and drains 16, 56 coupled to a supply voltage terminal or source 3A and 3B, respectively. The first driver transistor 10 is adapted for receiving an input RF signal through a connection between its gate 12 and an input terminal 2 and outputs a first intermediate AC signal at its drain 16. This first intermediate signal is provided to the gate 52 of the second driver transistor 50. A resulting processed (amplified) second intermediate AC signal is provided to two final transistors 20A, 20B through the drain-gate connections. The source electrodes 24A, 24B of the final transistors 20A, 20B are connected to ground or a reference voltage level and drains 26A, 26B are coupled to a supply voltage terminal or source 4A and 4B, respectively. The drains 26A, 26B are also connected to a common output terminal 5 for providing an output RF signal thereto.

A dynamic bias circuit 100 is connected to the drain 14 of the first transistor 10 for generating a bias signal based on the DC drain current of this transistor 10. In a first embodiment of the amplifier 1, the generated bias signal could then be applied by the bias applier 120 to the input (gate) electrodes 22A, 22B of the final transistors 20A, 20B in order to get a dynamic biasing and IMD suppression according to the technology disclosed herein. In a second embodiment, the bias signal is also applied to the gate 52 of the second driver transistor 50.

Figure 10:
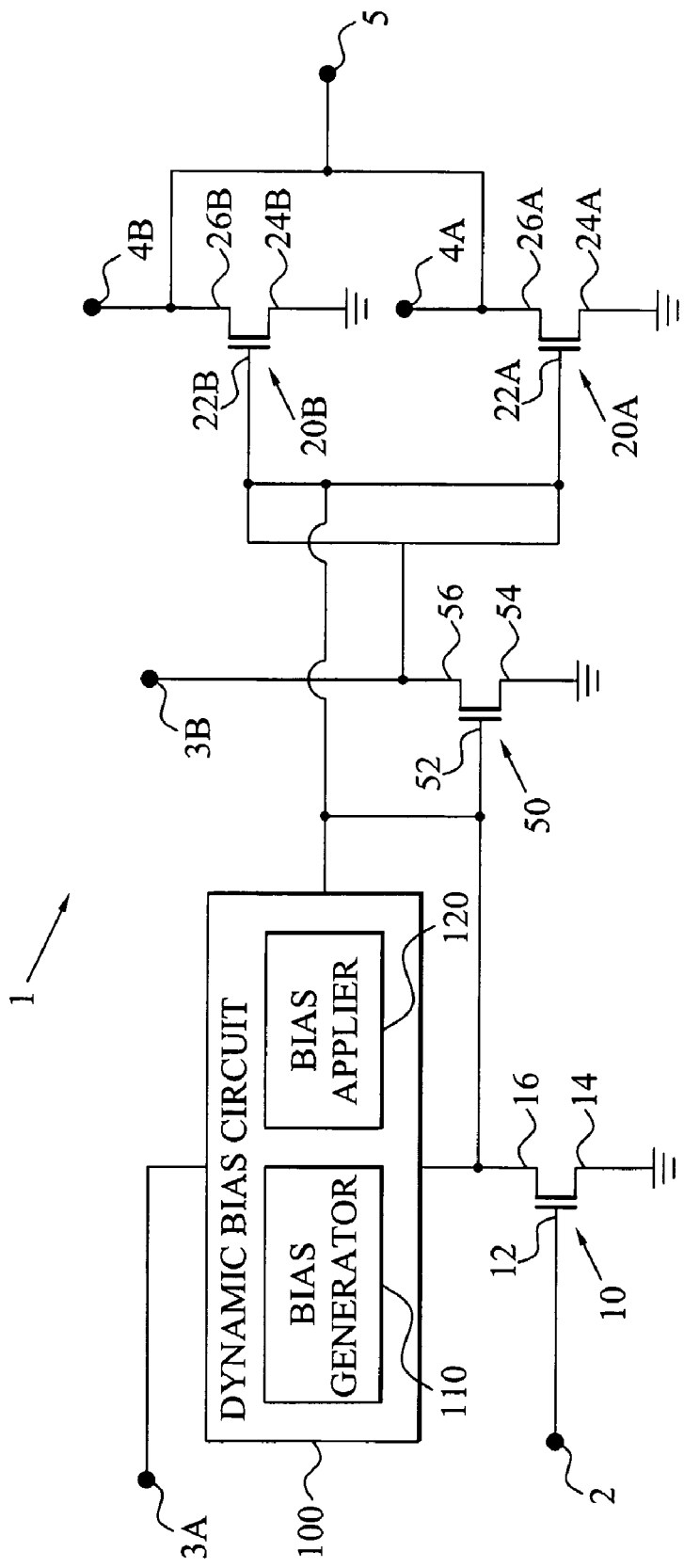
FIG. 10 is a schematic diagram of yet another example embodiment of a power amplifier with a dynamic bias circuit.

The power amplifiers of FIGS. 9 and 10 have been schematically disclosed in respective figure. It is anticipated that additional components, elements and circuitry could be added to the amplifiers giving a corresponding more detailed implementation as is illustrated in FIG. 8 for a cascaded transistor design. Generally, although not depicted, the amplifier circuitry as well as the dynamic bias circuitry discussed above and disclosed in FIGS. 1 and 3 to 10 may include any number of active diodes, additional capacitors and resistors in the final design as long as the basic operation of the dynamic bias circuit is not jeopardized. In addition, in operation, the dynamic bias circuit may be combined with other circuitry that may impact bias control to compensate for temperature, gain or other operation aspects.

Figure 11:
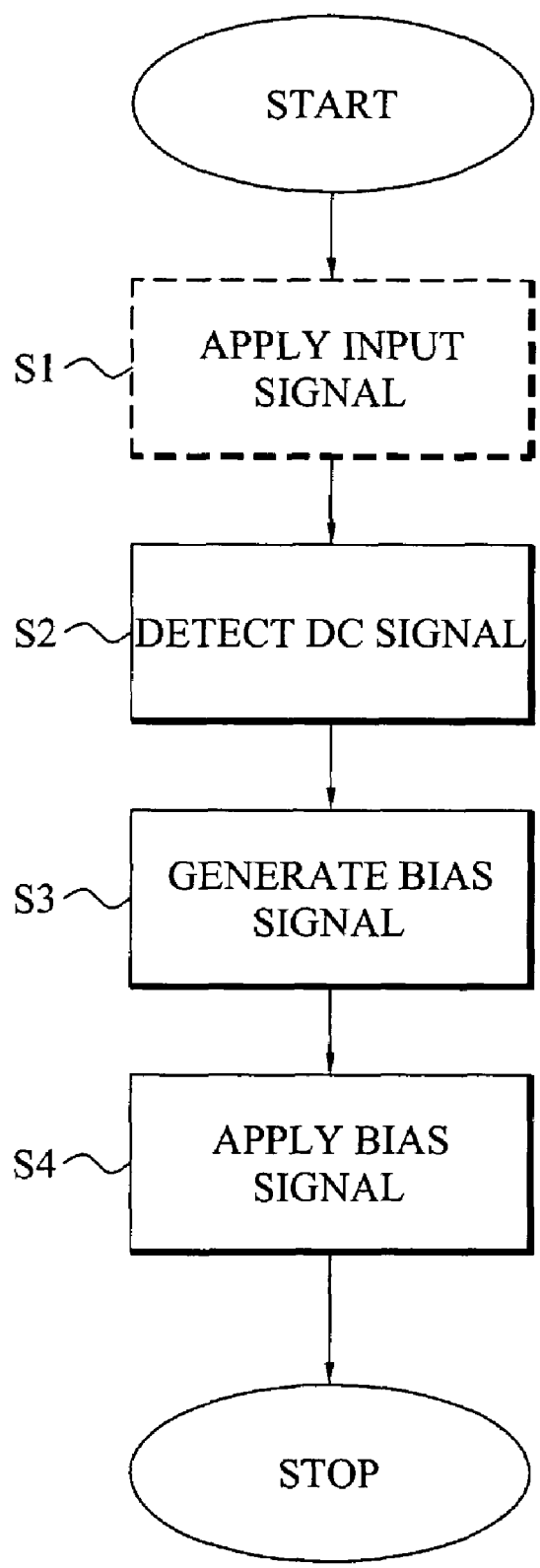
FIG. 11 is flow diagram illustrating an example method of dynamically biasing a power amplifier.

FIG. 11 is a flow diagram illustrating the method of dynamically biasing an amplifier comprising at least two interconnected transistors according to the technology disclosed herein. The method generally starts in step S1, where an input (RF) signal is applied to an input electrode of at least one of the transistors. A resulting DC signal, i.e. DC current signal, of the output electrode of at least a first (driver) transistor receiving the input signal is detected in step S2. A bias signal, e.g. DC voltage or current bias signal, is then generated in step S3 based on the detected DC signal. Due to the relation between the arising DC current signal and the power level of the input (RF) signal, the bias signal will be based on this input power. The generated bias signal is subsequently applied to, in step S4, an input electrode of at least a second (final) transistor for dynamically biasing the transistor and affecting the operation thereof in order to reduce IMD. The method then ends.

Figure 12:
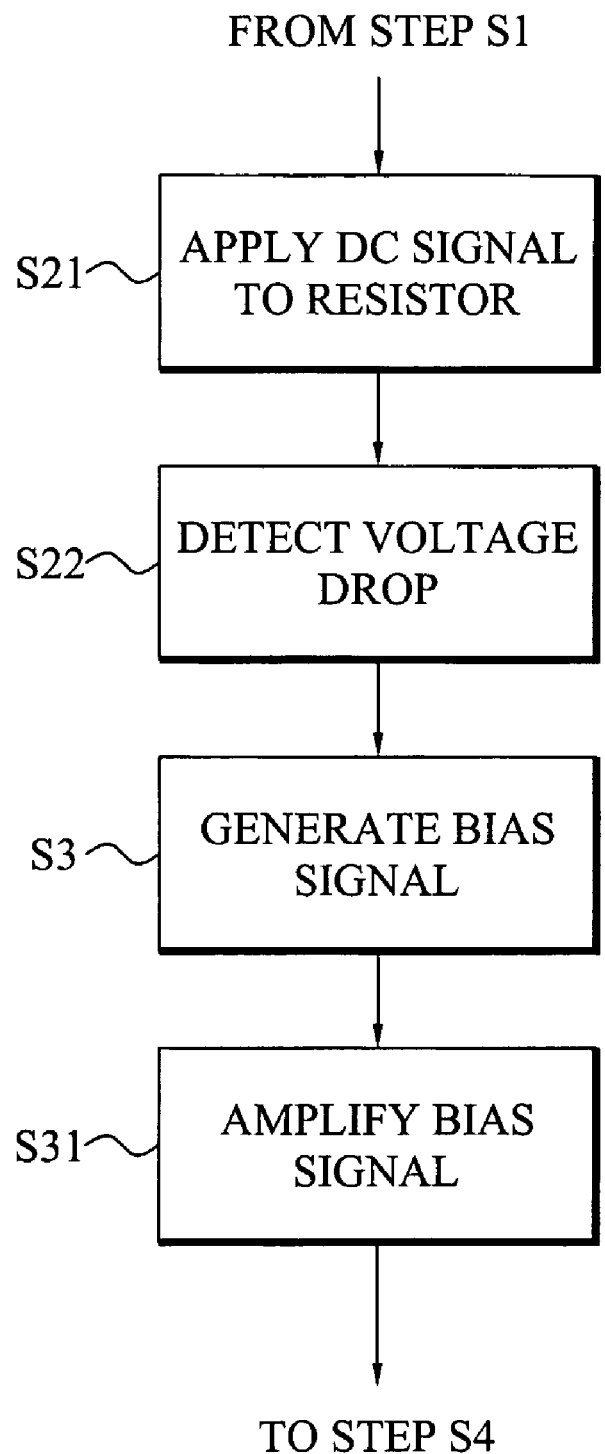
FIG. 12 is a flow diagram illustrating additional steps of the method of dynamically biasing a power amplifier.

FIG. 12 is a flow diagram illustrating the DC signal detecting step of FIG. 11 in more detail and an additional step of the biasing method of the technology disclosed herein. The method continues from step S1 of FIG. 10. In a next step S21, the resulting DC current signal is applied to a resistance element in order to generate a voltage drop thereover. Step S22 detects this arising voltage drop and the next step S3 generates a bias signal that depends on, e.g. proportional to, the detected voltage drop. The bias signal is then optionally amplified or otherwise adjusted in step S31 before application to the second transistor in step S4 of FIG. 11. This amplification or adjustment is preferably performed so that the bias signal becomes adjusted for the particular transistor, to which it is applied.

It will be understood by a person skilled in the art that various modifications and changes may be made to the present invention without departure from the scope thereof, which is defined by the appended claims.

The invention claimed is:

1. An amplifier comprising:
   a first and a second interconnected transistor;
   an associated dynamic biasing circuit comprising:
      means for generating a dynamic bias signal based on detection of a direct current, DC, signal of said first transistor; and
      means for applying said dynamic bias signal to said second transistor;
   said first transistor having an input electrode adapted for receiving an input signal and an output electrode connected to an input terminal of said dynamic biasing circuit and to an input electrode of said second transistor, said dynamic biasing circuit having an output terminal connected to said input electrode of said second transistor, and said second transistor having an output electrode adapted for providing an output signal.

2. The amplifier according to claim 1, wherein said DC signal is a DC current for said first transistor.

3. An amplifier comprising:
   a first and a second, interconnected transistor;
   an associated dynamic biasing circuit comprising:
      means for generating a dynamic bias signal based on detection of a direct current, DC, signal of said first transistor; and
      means for applying said dynamic bias signal to said second transistor;
   wherein an input electrode of said first transistor and of said second transistor is adapted for receiving an input signal and an output electrode of said first transistor and of said second transistor is adapted for providing an output signal, said dynamic biasing circuit having an input terminal connected to said output electrode of said first transistor and an output terminal distinct from the input terminal connected to a base electrode of said second transistor.

4. An amplifier comprising:
a first and a second interconnected transistor;
an associated dynamic biasing circuit comprising:
   means for generating a dynamic bias signal based on detection of a direct current, DC, signal of said first transistor; and
   means for applying said dynamic bias signal to said second transistor, said bias signal generating means being arranged for detecting a voltage drop caused by said DC signal and for generating said dynamic bias signal based on said detected voltage drop;
said dynamic biasing circuit comprising:
   resistance means connected to an output electrode of said first transistor and arranged for connection with a supply voltage;
   and an operation amplifier having a first input terminal connected to said output electrode of said first transistor, a second input terminal for connection with said first supply voltage and an output terminal connected to an input electrode of said second transistor, said operational amplifier being adapted for detecting said voltage drop as a difference between a first input voltage of said first input terminal and a second input voltage of said second input terminal.

5. The amplifier according to claim 4, wherein said operational amplifier is adapted for generating an output voltage signal proportional to said detected voltage drop, said dynamic bias signal comprising said output voltage signal.

6. The amplifier according to claim 1, wherein said dynamic biasing circuit comprises:
   resistance means connected to an output electrode of said first transistor and arranged for connection with a supply voltage;
   and a third transistor having an input terminal arranged for connection with said supply voltage and an output electrode connected to said output electrode of said first transistor and to an input electrode of said second transistor, said third transistor detecting said voltage drop as a difference between a first input voltage of said input electrode and a second input voltage of said output electrode.

7. The amplifier according to claim 1, further comprising a fourth transistor connected to said applying means and adapted for adjusting said dynamic bias signal for said second transistor.

8. An amplifier comprising:
a first and a second interconnected transistor;
an associated dynamic biasing circuit comprising:
   means for generating a dynamic bias signal based on detection of a direct current, DC, signal of said first transistor;
   means for applying said dynamic bias signal to said second transistor, said bias signal generating means being arranged for detecting a voltage drop caused by said DC signal and for generating said dynamic bias signal based on said detected voltage drop;
   a fifth transistor cascade connected to said first transistor, said applying means is configured for applying said dynamic bias signal to said fifth transistor;
   a first voltage dividing circuit having an input terminal connected to said applying means and an output terminal connected to said second transistor; and
   a second voltage dividing circuit having an input terminal connected to said applying means and an output terminal connected to said fifth transistor.

9. A dynamic biasing circuit for biasing an amplifier comprising a first transistor and a second interconnected transistor, said circuit comprising:
   means for generation a dynamic bias signal based on detection of a direct current DC, signal of said first transistor; and
   means for applying said dynamic bias signal to said second transistor;
   wherein bias signal generating means is arranged for detecting a voltage drop caused by said DC signal and for generating said dynamic bias signal based on said detected voltage drop, and wherein said dynamic biasing circuit comprises:
   resistance means connected to an output electrode of said first transistor and arranged for connection with a supply voltage; and
   an operation amplifier having a first input terminal connected to said output electrode of said first transistor, a second input terminal for connection with said first supply voltage and an output terminal connected to an input electrode of said second transistor, said operational amplifier detecting said voltage drop as a difference between a first input voltage of said first input terminal and a second input voltage of said second input terminal.

10. The circuit according to claim 9, wherein said DC signal is a DC current for said first transistor.

11. The circuit according to claim 9, wherein said operational amplifier is adapted for generating an output voltage signal proportional to said detected voltage drop, said dynamic bias signal comprising said output voltage signal.

12. The circuit according to claim 9, wherein said dynamic biasing circuit comprises:
   resistance means connected to an output electrode of said first transistor and arranged for connection with a supply voltage; and
   a third transistor having an input terminal arranged for connection with said supply voltage and an output electrode connected to said output electrode of said first transistor and to an input electrode of said second transistor, said third transistor detecting said voltage drop as a difference between a first input voltage of said input electrode and a second input voltage of said output electrode.

13. The circuit according to claim 9, further comprising a fourth transistor connected to said applying means and adapted for adjusting said dynamic bias signal for said dynamically biasing circuit.

14. A method for dynamically biasing an amplifier comprising a first transistor and a second interconnected transistor, the method comprises:
   applying an input signal to an input electrode of said first transistor and to an input electrode of the second transistor;
   applying a direct current signal of the first transistor to an in put electrode of said second transistor and to an input terminal of a dynamic biasing circuit;
   generating with the dynamic biasing circuit dynamic bias signal based on detection of a the direct current signal of said first transistor; and applying said dynamic bias voltage signal to the input electrode of said second transistor;
outputting an amplified signal from an output electrode of the second transistor.

15. The method according to claim 14, wherein said direct current signal is a direct current for said first transistor.

16. The method according to claim 14, wherein generating said bias signal comprises:
applying said direct current signal to at least one resistance;
detecting a voltage drop over said resistance caused by said direct current signal; and
generating a voltage signal proportional to said detected voltage drop, said dynamic bias signal comprises said generated voltage signal.

17. The method according to claim 14, wherein generating said bias signal comprises adjusting said dynamic bias signal for said second transistor.

18. An amplifier comprising:
a first and a second interconnected transistor;
an associated dynamic biasing circuit comprising a dynamic bias signal generator configured to generate a bias signal for application to the second transistor based on detection of a direct current signal of said first transistor; and
said first transistor having an input electrode adapted for receiving an input signal and an output electrode connected to an input terminal of said dynamic biasing circuit and to an input electrode of said second transistor, said dynamic biasing circuit having an output terminal connected to said input electrode of said second transistor, and said second transistor having an output electrode adapted for providing an output signal.

19. An amplifier comprising:
a first and a second interconnected transistor;
an associated dynamic biasing circuit comprising a dynamic bias signal generator configured to generate a bias signal for application to the second transistor based on detection of a direct current signal of said first transistor;
wherein an input electrode of said first transistor and of said second transistor is adapted for receiving an input signal and an output electrode of said first transistor and of said second transistor is adapted for providing an output signal, said dynamic biasing circuit having an input terminal connected to said output electrode of said first transistor and an output terminal distinct from the input terminal connected to a base electrode of said second transistor.

20. An amplifier comprising:
a first and a second interconnected transistor;
an associated dynamic biasing circuit comprising a dynamic bias signal generator configured to generate a bias signal for application to the second transistor based on detection of a direct current signal of said first transistor, said bias signal generator being arranged for detecting a voltage drop caused by said DC signal and for generating said dynamic bias signal based on said detected voltage drop;
said dynamic biasing circuit comprising:
at least one resistor connected to an output electrode of said first transistor and arranged for connection with a supply voltage;
and an operation amplifier having a first input terminal connected to said output electrode of said first transistor, a second input terminal for connection with said first supply voltage and an output terminal connected to an input electrode of said second transistor, said operational amplifier being adapted for detecting said voltage drop as a difference between a first input voltage of said first input terminal and a second input voltage of said second input terminal.

* * * * *